US011478015B2

(12) United States Patent
Kim et al.

(10) Patent No.: US 11,478,015 B2
(45) Date of Patent: Oct. 25, 2022

(54) VAPORIZER OF AN AEROSOL GENERATING DEVICE HAVING A LEAKAGE-PREVENTING STRUCTURE

(71) Applicant: KT&G CORPORATION, Daejeon (KR)

(72) Inventors: Tae Hun Kim, Yongin-si (KR); Jong Sun Park, Suwon-si (KR); Hwan Ock Choe, Changwon-si (KR)

(73) Assignee: KT&G CORPORATION, Daejeon (KR)

( * ) Notice: Subject to any disclaimer, the term of this patent is extended or adjusted under 35 U.S.C. 154(b) by 94 days.

(21) Appl. No.: 16/759,393

(22) PCT Filed: Oct. 26, 2018

(86) PCT No.: PCT/KR2018/012775
§ 371 (c)(1),
(2) Date: Apr. 27, 2020

(87) PCT Pub. No.: WO2019/088579
PCT Pub. Date: May 9, 2019

(65) Prior Publication Data
US 2020/0288778 A1    Sep. 17, 2020

(30) Foreign Application Priority Data

Oct. 30, 2017 (KR) .......................... 10-2017-0142578
Jun. 25, 2018 (KR) .......................... 10-2018-0072992

(51) Int. Cl.
*A24F 40/42* (2020.01)
*A24F 40/90* (2020.01)
(Continued)

(52) U.S. Cl.
CPC ............ *A24F 40/42* (2020.01); *A24B 15/167* (2016.11); *A24D 1/20* (2020.01); *A24D 3/17* (2020.01);
(Continued)

(58) Field of Classification Search
CPC .......... A24F 40/42; A24F 40/10; A24F 40/20; A24F 40/44
See application file for complete search history.

(56) References Cited

U.S. PATENT DOCUMENTS

| 5,348,027 A | 9/1994 | Barnes et al. |
| 5,388,594 A | 2/1995 | Counts et al. |

(Continued)

FOREIGN PATENT DOCUMENTS

| CA | 2 778 903 A1 | 5/2011 |
| CA | 2 970 045 A1 | 6/2016 |

(Continued)

OTHER PUBLICATIONS

Extended European Search Report dated Jan. 15, 2021 in European Application No. 18799246.6.
(Continued)

*Primary Examiner* — Hae Moon Hyeon
(74) *Attorney, Agent, or Firm* — Sughrue Mion, PLLC

(57) ABSTRACT

A vaporizer includes a liquid storage configured to store a liquid composition, an aerosol generator coupled to one end of the liquid storage, and including a wick configured to absorb the liquid composition from the liquid storage, a liquid heater configured to generate aerosol by heating the wick, an aerosol chamber surrounding the wick and the liquid heater, an inlet through which external air is introduced into the aerosol chamber, and an outlet through which the aerosol generated in the aerosol chamber is discharged, and an air supplier configured to supply the external air to
(Continued)

the aerosol generator, and including a first opening connected to the inlet of the aerosol generator and a second opening that is opposite to the first opening and connected to the outside at a position spaced apart from the first opening along a direction from the one end to another end of the liquid storage.

10 Claims, 9 Drawing Sheets

(51) Int. Cl.
    *A24F 40/46*     (2020.01)
    *A24B 15/167*     (2020.01)
    *A24F 40/20*     (2020.01)
    *A24F 40/30*     (2020.01)
    *A24D 3/17*     (2020.01)
    *A24D 1/20*     (2020.01)
    *A24F 40/60*     (2020.01)
    *F21V 3/00*     (2015.01)
    *F21V 5/00*     (2018.01)
    *G02B 19/00*     (2006.01)
    *H05B 3/54*     (2006.01)
    *A24F 40/485*     (2020.01)
    *A24F 40/10*     (2020.01)
    *A24F 40/44*     (2020.01)
    *A24F 40/40*     (2020.01)
    *A24F 40/57*     (2020.01)
    *A24F 40/65*     (2020.01)
    *H05K 1/02*     (2006.01)
    *H05K 1/14*     (2006.01)
    *H05K 1/18*     (2006.01)
    *A24F 40/50*     (2020.01)
    *A24F 40/95*     (2020.01)
    *A24F 15/01*     (2020.01)
    *A24F 40/51*     (2020.01)
    *F21Y 115/10*     (2016.01)

(52) U.S. Cl.
    CPC .............. *A24F 15/01* (2020.01); *A24F 40/10* (2020.01); *A24F 40/20* (2020.01); *A24F 40/30* (2020.01); *A24F 40/40* (2020.01); *A24F 40/44* (2020.01); *A24F 40/46* (2020.01); *A24F 40/485* (2020.01); *A24F 40/50* (2020.01); *A24F 40/57* (2020.01); *A24F 40/60* (2020.01); *A24F 40/65* (2020.01); *A24F 40/90* (2020.01); *A24F 40/95* (2020.01); *F21V 3/00* (2013.01); *F21V 5/00* (2013.01); *G02B 19/0009* (2013.01); *G02B 19/0061* (2013.01); *H05B 3/54* (2013.01); *H05K 1/0203* (2013.01); *H05K 1/0277* (2013.01); *H05K 1/148* (2013.01); *H05K 1/181* (2013.01); *A24F 40/51* (2020.01); *F21Y 2115/10* (2016.08); *H05K 2201/012* (2013.01); *H05K 2201/0154* (2013.01); *H05K 2201/10219* (2013.01)

(56) References Cited

U.S. PATENT DOCUMENTS

| | | |
|---|---|---|
| 5,408,574 A | 4/1995 | Deevi et al. |
| 5,505,214 A | 4/1996 | Collins et al. |
| 5,555,476 A | 9/1996 | Suzuki et al. |
| 5,692,525 A | 12/1997 | Counts et al. |
| 5,723,228 A | 3/1998 | Okamoto |
| 5,750,964 A | 5/1998 | Counts et al. |
| 5,878,752 A | 3/1999 | Adams et al. |
| 5,902,501 A | 5/1999 | Nunnally et al. |
| 5,949,346 A | 9/1999 | Suzuki et al. |
| 6,026,820 A | 2/2000 | Baggett, Jr. et al. |
| 6,615,840 B1 | 9/2003 | Fournier et al. |
| 6,803,550 B2 | 10/2004 | Sharpe et al. |
| 6,810,883 B2 | 11/2004 | Felter et al. |
| 7,082,825 B2 | 8/2006 | Aoshima et al. |
| 7,594,945 B2 | 9/2009 | Kim et al. |
| 7,682,571 B2 | 3/2010 | Kim et al. |
| 7,726,320 B2 | 6/2010 | Robinson et al. |
| 8,205,622 B2 | 6/2012 | Pan |
| 8,558,147 B2 | 10/2013 | Greim et al. |
| 8,602,037 B2 | 12/2013 | Inagaki |
| 8,689,804 B2 | 4/2014 | Fernando et al. |
| 8,833,364 B2 | 9/2014 | Buchberger |
| 8,997,754 B2 | 4/2015 | Tucker et al. |
| 9,084,440 B2 | 7/2015 | Zuber et al. |
| 9,165,484 B2 | 10/2015 | Choi |
| 9,254,007 B2 | 2/2016 | Liu |
| 9,295,286 B2 | 3/2016 | Shin |
| 9,347,644 B2 | 5/2016 | Araki et al. |
| 9,405,148 B2 | 8/2016 | Chang et al. |
| 9,420,829 B2 | 8/2016 | Thorens et al. |
| 9,516,899 B2 | 12/2016 | Plojoux et al. |
| 9,532,600 B2 | 1/2017 | Thorens et al. |
| 9,541,820 B2 | 1/2017 | Ogawa |
| 9,693,587 B2 | 7/2017 | Plojoux et al. |
| 9,713,345 B2 | 7/2017 | Farine et al. |
| 9,839,238 B2 | 12/2017 | Worm et al. |
| 9,844,234 B2 | 12/2017 | Thorens et al. |
| 9,848,651 B2 | 12/2017 | Wu |
| 9,854,845 B2 | 1/2018 | Plojoux et al. |
| 9,949,507 B2 | 4/2018 | Flick |
| 9,974,117 B2 | 5/2018 | Qiu |
| 10,070,667 B2 | 9/2018 | Lord et al. |
| 10,104,909 B2 | 10/2018 | Han et al. |
| 10,104,911 B2 | 10/2018 | Thorens et al. |
| 10,136,673 B2 | 11/2018 | Mironov |
| 10,136,675 B2 | 11/2018 | Li et al. |
| 10,143,232 B2 | 12/2018 | Talon |
| 10,238,149 B2 | 3/2019 | Hon |
| 10,390,564 B2 | 8/2019 | Fernando et al. |
| 10,412,994 B2 | 9/2019 | Schennum et al. |
| 10,426,193 B2 | 10/2019 | Schennum et al. |
| 10,548,350 B2 | 2/2020 | Greim et al. |
| 10,555,555 B2 | 2/2020 | Fernando et al. |
| 10,602,778 B2 | 3/2020 | Hu et al. |
| 10,617,149 B2 | 4/2020 | Malgat et al. |
| 10,694,783 B2 | 6/2020 | Jochnowitz |
| 10,701,973 B2 | 7/2020 | Lee |
| 10,842,194 B2 | 11/2020 | Batista et al. |
| 10,973,087 B2 | 4/2021 | Wang et al. |
| 11,051,545 B2 | 7/2021 | Batista et al. |
| 11,051,550 B2 | 7/2021 | Lin et al. |
| 11,147,316 B2 | 10/2021 | Farine et al. |
| 2003/0226837 A1 | 12/2003 | Blake et al. |
| 2004/0089314 A1 | 5/2004 | Felter et al. |
| 2004/0149737 A1 | 8/2004 | Sharpe et al. |
| 2005/0142036 A1 | 6/2005 | Kim et al. |
| 2006/0267614 A1 | 11/2006 | Lee et al. |
| 2007/0007266 A1 | 1/2007 | Sasaki et al. |
| 2007/0074734 A1 | 4/2007 | Braunshteyn et al. |
| 2007/0246382 A1 | 10/2007 | He |
| 2007/0267031 A1 | 11/2007 | Hon |
| 2010/0313901 A1 | 12/2010 | Fernando et al. |
| 2011/0226236 A1 | 9/2011 | Buchberger |
| 2011/0234069 A1 | 9/2011 | Chen et al. |
| 2013/0014772 A1 | 1/2013 | Liu |
| 2013/0228191 A1 | 9/2013 | Newton |
| 2013/0255675 A1 | 10/2013 | Liu |
| 2014/0060554 A1 | 3/2014 | Collett et al. |
| 2014/0069424 A1 | 3/2014 | Poston et al. |
| 2014/0209105 A1 | 7/2014 | Sears et al. |
| 2014/0217085 A1 | 8/2014 | Alima |
| 2014/0261487 A1 | 9/2014 | Chapman et al. |
| 2014/0286630 A1 | 9/2014 | Buchberger |
| 2014/0339509 A1 | 11/2014 | Choi et al. |
| 2014/0345633 A1 | 11/2014 | Talon et al. |
| 2014/0353856 A1 | 12/2014 | Dubief |
| 2015/0020831 A1 | 1/2015 | Weigensberg et al. |

(56) References Cited

U.S. PATENT DOCUMENTS

| | | | |
|---|---|---|---|
| 2015/0223520 A1 | 8/2015 | Phillips et al. | |
| 2015/0230521 A1 | 8/2015 | Talon | |
| 2015/0282527 A1 | 10/2015 | Henry, Jr. | |
| 2015/0327596 A1* | 11/2015 | Alarcon | A61M 15/06 131/328 |
| 2016/0103364 A1 | 4/2016 | Nam et al. | |
| 2016/0128386 A1 | 5/2016 | Chen | |
| 2016/0174613 A1 | 6/2016 | Zuber et al. | |
| 2016/0205998 A1 | 7/2016 | Matsumoto et al. | |
| 2016/0321879 A1 | 11/2016 | Oh et al. | |
| 2016/0324216 A1 | 11/2016 | Li et al. | |
| 2016/0331030 A1 | 11/2016 | Ampolini et al. | |
| 2016/0345625 A1 | 12/2016 | Liu | |
| 2017/0020195 A1 | 1/2017 | Cameron | |
| 2017/0042227 A1 | 2/2017 | Gavrielov et al. | |
| 2017/0055589 A1 | 3/2017 | Fernando et al. | |
| 2017/0119051 A1 | 5/2017 | Blandino et al. | |
| 2017/0119053 A1 | 5/2017 | Henry, Jr. et al. | |
| 2017/0143041 A1 | 5/2017 | Batista et al. | |
| 2017/0188634 A1 | 7/2017 | Plojoux et al. | |
| 2017/0197043 A1 | 7/2017 | Buchberger | |
| 2017/0197046 A1 | 7/2017 | Buchberger | |
| 2017/0214261 A1 | 7/2017 | Gratton | |
| 2017/0238609 A1 | 8/2017 | Schlipf | |
| 2017/0295844 A1 | 10/2017 | Thevenaz et al. | |
| 2017/0325505 A1 | 11/2017 | Force et al. | |
| 2017/0347715 A1 | 12/2017 | Mironov et al. | |
| 2018/0027878 A1 | 2/2018 | Dendy et al. | |
| 2018/0028993 A1 | 2/2018 | Dubief | |
| 2018/0160733 A1 | 6/2018 | Leadley et al. | |
| 2018/0199630 A1 | 7/2018 | Qiu | |
| 2019/0059448 A1 | 2/2019 | Talon | |
| 2019/0159524 A1 | 5/2019 | Qiu | |
| 2019/0281896 A1 | 9/2019 | Chapman et al. | |
| 2020/0093177 A1 | 3/2020 | Han et al. | |
| 2020/0093185 A1 | 3/2020 | Lim | |
| 2020/0094997 A1 | 3/2020 | Menon et al. | |
| 2020/0154765 A1 | 5/2020 | Lee et al. | |
| 2020/0196670 A1 | 6/2020 | Alarcon et al. | |
| 2020/0260790 A1 | 8/2020 | Kaufman et al. | |
| 2020/0305240 A1 | 9/2020 | Holoubek et al. | |
| 2020/0329772 A1 | 10/2020 | Kim et al. | |
| 2020/0345066 A1* | 11/2020 | Kim | A24F 40/42 |
| 2020/0359681 A1 | 11/2020 | Han et al. | |
| 2020/0404969 A1 | 12/2020 | Zuber et al. | |

FOREIGN PATENT DOCUMENTS

| | | | |
|---|---|---|---|
| CN | 1078621 A | 11/1993 | |
| CN | 1126425 A | 7/1996 | |
| CN | 1190335 A | 8/1998 | |
| CN | 1280661 A | 1/2001 | |
| CN | 1491598 A | 4/2004 | |
| CN | 1633247 A | 6/2005 | |
| CN | 1871987 A | 12/2006 | |
| CN | 101277622 A | 10/2008 | |
| CN | 101324490 A | 12/2008 | |
| CN | 101518361 A | 9/2009 | |
| CN | 101557728 A | 10/2009 | |
| CN | 101637308 A | 2/2010 | |
| CN | 201657047 U | 11/2010 | |
| CN | 102264251 A | 11/2011 | |
| CN | 102595943 A | 7/2012 | |
| CN | 202385727 U | 8/2012 | |
| CN | 102665459 A | 9/2012 | |
| CN | 103099319 A | 5/2013 | |
| CN | 202907797 U | 5/2013 | |
| CN | 203040065 U | 7/2013 | |
| CN | 103271447 A | 9/2013 | |
| CN | 103477252 A | 12/2013 | |
| CN | 103519351 A | 1/2014 | |
| CN | 203435688 U * | 2/2014 | |
| CN | 103653257 A | 3/2014 | |
| CN | 103653258 A | 3/2014 | |
| CN | 203492793 U | 3/2014 | |
| CN | 103889258 A | 6/2014 | |
| CN | 103974635 A | 8/2014 | |
| CN | 103974638 A | 8/2014 | |
| CN | 103974640 A | 8/2014 | |
| CN | 103997922 A | 8/2014 | |
| CN | 104146353 A | 11/2014 | |
| CN | 104188110 A | 12/2014 | |
| CN | 104219973 A | 12/2014 | |
| CN | 204120226 U | 1/2015 | |
| CN | 204146340 U | 2/2015 | |
| CN | 104423130 A | 3/2015 | |
| CN | 204393344 U | 6/2015 | |
| CN | 104886776 A | 9/2015 | |
| CN | 105188430 A | 12/2015 | |
| CN | 204838003 U | 12/2015 | |
| CN | 105326092 A | 2/2016 | |
| CN | 205072064 U | 3/2016 | |
| CN | 205180371 U | 4/2016 | |
| CN | 105722416 A | 6/2016 | |
| CN | 205358225 U | 7/2016 | |
| CN | 105852221 A | 8/2016 | |
| CN | 205456064 U | 8/2016 | |
| CN | 205624474 U | 10/2016 | |
| CN | 106136331 A | 11/2016 | |
| CN | 106163304 A | 11/2016 | |
| CN | 106170215 A | 11/2016 | |
| CN | 205671480 U | 11/2016 | |
| CN | 106231934 A | 12/2016 | |
| CN | 106235419 A | 12/2016 | |
| CN | 205831079 U | 12/2016 | |
| CN | 106418729 A | 2/2017 | |
| CN | 106473232 A | 3/2017 | |
| CN | 106473233 A | 3/2017 | |
| CN | 106490686 A | 3/2017 | |
| CN | 106690427 A | 5/2017 | |
| CN | 106723379 A | 5/2017 | |
| CN | 106793834 A | 5/2017 | |
| CN | 206197012 U | 5/2017 | |
| CN | 106912985 A | 7/2017 | |
| CN | 206314585 U | 7/2017 | |
| CN | 106998816 A | 8/2017 | |
| CN | 107105772 A | 8/2017 | |
| CN | 206442590 U | 8/2017 | |
| CN | 206443202 U | 8/2017 | |
| CN | 206443214 U | 8/2017 | |
| CN | 107173850 A | 9/2017 | |
| CN | 107183789 A | 9/2017 | |
| CN | 206462413 U | 9/2017 | |
| CN | 107249366 A | 10/2017 | |
| CN | 107278125 A | 10/2017 | |
| CN | 206547882 U | 10/2017 | |
| CN | 107801375 A | 3/2018 | |
| CN | 108013512 A | 5/2018 | |
| CN | 110325058 A | 10/2019 | |
| CN | 110958841 A | 4/2020 | |
| EA | 201290392 A1 | 10/2012 | |
| EA | 201290240 A1 | 12/2012 | |
| EA | 026076 B1 | 2/2017 | |
| EP | 0 438 862 A2 | 7/1991 | |
| EP | 0 917 831 A1 | 5/1999 | |
| EP | 0 822 760 B1 | 6/2003 | |
| EP | 1 947 965 A2 | 7/2008 | |
| EP | 2 201 850 A1 | 6/2010 | |
| EP | 2 316 286 A1 | 5/2011 | |
| EP | 2 340 729 A1 | 7/2011 | |
| EP | 2368449 A1 | 9/2011 | |
| EP | 2 677 273 A1 | 12/2013 | |
| EP | 2 921 065 A1 | 9/2015 | |
| EP | 3 248 486 B1 | 8/2019 | |
| EP | 3 248 485 B1 | 4/2020 | |
| EP | 3 656 229 A2 | 5/2020 | |
| ER | 2 327 318 A1 | 6/2011 | |
| ER | 3 257 386 B1 | 6/2019 | |
| ER | 3 569 076 A1 | 11/2019 | |
| GB | 2 301 894 A | 12/1996 | |
| GB | 2514893 A | 12/2014 | |
| JP | 62-15793 A | 1/1987 | |
| JP | 6-73784 U | 10/1994 | |

(56) References Cited

FOREIGN PATENT DOCUMENTS

| | | |
|---|---|---|
| JP | 7-72809 A | 3/1995 |
| JP | 7-184627 A | 7/1995 |
| JP | 9-75058 A | 3/1997 |
| JP | 9-161822 A | 6/1997 |
| JP | 9-228919 A | 9/1997 |
| JP | 10-37781 A | 2/1998 |
| JP | 2003-527127 A | 9/2003 |
| JP | 2004-212102 A | 7/2004 |
| JP | 2005-199913 A | 7/2005 |
| JP | 2006-292620 A | 10/2006 |
| JP | 3898118 B2 | 3/2007 |
| JP | 2007-101639 A | 4/2007 |
| JP | 2010-266425 A | 11/2010 |
| JP | 2013-509160 A | 3/2013 |
| JP | 2013-524835 A | 6/2013 |
| JP | 2014-216287 A | 11/2014 |
| JP | 2014-533513 A | 12/2014 |
| JP | 2015-13192 A | 1/2015 |
| JP | 2015-503916 A | 2/2015 |
| JP | 2015-504669 A | 2/2015 |
| JP | 2015-506170 A | 3/2015 |
| JP | 2015-528307 A | 9/2015 |
| JP | 2016-512033 A | 4/2016 |
| JP | 2016-521552 A | 7/2016 |
| JP | 2017-506901 A | 3/2017 |
| JP | 2017-510270 A | 4/2017 |
| JP | 2017-511123 A | 4/2017 |
| JP | 2017-127300 A | 7/2017 |
| JP | 2017-522876 A | 8/2017 |
| KR | 1999-0081973 A | 11/1999 |
| KR | 20-0203233 Y1 | 11/2000 |
| KR | 10-0304044 B1 | 11/2001 |
| KR | 10-2004-0084899 A | 10/2004 |
| KR | 10-2005-0065896 A | 6/2005 |
| KR | 10-0495099 B1 | 11/2005 |
| KR | 10-2006-0121638 A | 11/2006 |
| KR | 10-0782063 B1 | 12/2007 |
| KR | 10-1012472 B1 | 2/2011 |
| KR | 10-2011-0096548 A | 8/2011 |
| KR | 10-1062248 B1 | 9/2011 |
| KR | 20-2011-0008931 U | 9/2011 |
| KR | 10-2012-0027029 A | 3/2012 |
| KR | 10-2012-0050568 A | 5/2012 |
| KR | 20-0460461 Y1 | 5/2012 |
| KR | 10-1174189 B1 | 8/2012 |
| KR | 10-2012-0101637 A | 9/2012 |
| KR | 10-2012-0102131 A | 9/2012 |
| KR | 10-2012-0104533 A | 9/2012 |
| KR | 10-2012-0115488 A | 10/2012 |
| KR | 20-2012-0007263 U | 10/2012 |
| KR | 20-2012-0008751 U | 12/2012 |
| KR | 10-2013-0031025 A | 3/2013 |
| KR | 10-1239080 B1 | 3/2013 |
| KR | 10-2013-0084789 A | 7/2013 |
| KR | 10-2013-0139276 A | 12/2013 |
| KR | 10-2013-0139298 A | 12/2013 |
| KR | 10-1338073 B1 | 12/2013 |
| KR | 10-2014-0116055 A | 10/2014 |
| KR | 10-2014-0116381 A | 10/2014 |
| KR | 10-2014-0118980 A | 10/2014 |
| KR | 10-2014-0119029 A | 10/2014 |
| KR | 10-2014-0135568 A | 11/2014 |
| KR | 10-1465846 B1 | 11/2014 |
| KR | 10-1480423 B1 | 1/2015 |
| KR | 10-1486294 B1 | 1/2015 |
| KR | 10-2015-0111021 A | 10/2015 |
| KR | 10-2016-0005323 A | 1/2016 |
| KR | 10-2016-0012154 A | 2/2016 |
| KR | 10-2016-0031801 A | 3/2016 |
| KR | 10-2016-0052607 A | 5/2016 |
| KR | 10-1631286 B1 | 6/2016 |
| KR | 10-1635340 B1 | 6/2016 |
| KR | 10-2016-0082570 A | 7/2016 |
| KR | 10-2016-0086118 A | 7/2016 |
| KR | 10-2016-0088163 A | 7/2016 |
| KR | 10-1660214 B1 | 9/2016 |
| KR | 10-1677547 B1 | 11/2016 |
| KR | 10-1679163 B1 | 11/2016 |
| KR | 10-2017-0006282 A | 1/2017 |
| KR | 10-2017-0020807 A | 2/2017 |
| KR | 10-1733448 B1 | 5/2017 |
| KR | 10-2017-0067171 A | 6/2017 |
| KR | 10-1740108 B1 | 6/2017 |
| KR | 10-2017-0083596 A | 7/2017 |
| KR | 10-2017-0117444 A | 10/2017 |
| KR | 10-2017-0118233 A | 10/2017 |
| KR | 10-2018-0001840 A | 1/2018 |
| KR | 10-2018-0125852 A | 11/2018 |
| KR | 10-2018-0129637 A | 12/2018 |
| KR | 10-2019-0016907 A | 2/2019 |
| RU | 2 132 629 C1 | 7/1999 |
| RU | 2551944 C1 | 6/2015 |
| RU | 2611487 C2 | 2/2017 |
| RU | 2617297 C2 | 4/2017 |
| RU | 2 619 735 C1 | 5/2017 |
| RU | 2015152134 A | 6/2017 |
| WO | 95/27412 A1 | 10/1995 |
| WO | 98/23171 A1 | 6/1998 |
| WO | 2007039794 A2 | 4/2007 |
| WO | 2009/044716 A1 | 4/2009 |
| WO | 2010073122 A1 | 7/2010 |
| WO | 2011/015826 A1 | 2/2011 |
| WO | 2011/050964 A1 | 5/2011 |
| WO | 2011/063970 A1 | 6/2011 |
| WO | 2013/102609 A2 | 7/2013 |
| WO | 2014/195679 A2 | 12/2014 |
| WO | 2015/035510 A1 | 3/2015 |
| WO | 2015/070402 A1 | 5/2015 |
| WO | 2015/082560 A1 | 6/2015 |
| WO | 2015/174657 A1 | 11/2015 |
| WO | 2015/177046 A1 | 11/2015 |
| WO | 2015/189388 A1 | 12/2015 |
| WO | 2016/009202 A1 | 1/2016 |
| WO | 2016/012795 A1 | 1/2016 |
| WO | 2016/096337 A1 | 6/2016 |
| WO | 2016/111633 A1 | 7/2016 |
| WO | 2016/123738 A1 | 8/2016 |
| WO | 2016/127541 A1 | 8/2016 |
| WO | 2016120177 A1 | 8/2016 |
| WO | 2016/138689 A1 | 9/2016 |
| WO | 2016/199065 A1 | 12/2016 |
| WO | 2016/199066 A1 | 12/2016 |
| WO | 2016/207407 A1 | 12/2016 |
| WO | 2017/001818 A1 | 1/2017 |
| WO | 2017/005471 A1 | 1/2017 |
| WO | 2017/029089 A1 | 2/2017 |
| WO | 2017/077466 A1 | 5/2017 |
| WO | 2017/133056 A1 | 8/2017 |
| WO | 2017/163046 A1 | 9/2017 |
| WO | 2017/182485 A1 | 10/2017 |
| WO | 2017/211600 A1 | 12/2017 |
| WO | 2018/190606 A1 | 10/2018 |
| WO | 2018/191766 A1 | 10/2018 |
| WO | 2019/015343 A1 | 1/2019 |

OTHER PUBLICATIONS

Office Action dated May 25, 2020 in Russian Application No. 2019135871.
Office Action dated Jun. 10, 2020 in Korean Application No. 10-2018-0052137.
Office Action dated Oct. 5, 2020 in Korean Application No. 10-2020-0090577.
Office Action dated Oct. 16, 2020 in Korean Application No. 10-2020-0092553.
Extended European Search Report dated Nov. 16, 2020 in European Application No. 20189002.7.
Office Action dated Dec. 8, 2020 in Russian Application No. 2020113632.
Office Action dated Nov. 25, 2020 in Russian Application No. 2020124810.
Office Action dated Jan. 26, 2021 in Japanese Application No. 2020-502671.

(56) References Cited

OTHER PUBLICATIONS

Office Action dated Dec. 22, 2020 in Japanese Application No. 2020-502181.
Office Action dated Dec. 22, 2020 in Japanese Application No. 2020-503856.
Extended European Search Report dated Nov. 13, 2020 in European Application No. 20188970.6.
Office Action dated Nov. 10, 2020 in Japanese Application No. 2020-523671.
Office Action dated Nov. 24, 2020 in Russian Application No. 2020124811.
Extended European Search Report dated Sep. 9, 2021 in European Application No. 18873562.5.
Office Action dated Aug. 3, 2021 in Japanese Application No. 2020-503856.
Extended European Search Report dated Aug. 18, 2021 in European Application No. 18874344.7.
Extended European Search Report dated Jul. 30, 2021 in European Application No. 18874446.0.
Extended European Search Report dated Aug. 17, 2021 in European Application No. 18872432.2.
Office Action dated Aug. 17, 2021 in Japanese Application No. 2020-503962.
Extended European Search Report dated Aug. 10, 2021 in European Application No. 18873846.2.
Extended European Search Report dated Aug. 17, 2021 in European Application No. 18873943.7.
Extended European Search Report dated Aug. 10, 2021 in European Application No. 18874742.2.
Extended European Search Report dated Aug. 12, 2021 in European Application No. 18874837.0.
Extended European Search Report dated Aug. 20, 2021 in European Application No. 18874962.6.
Extended European Search Report dated Aug. 6, 2021 in European Application No. 18872527.9.
Extended European Search Report dated Sep. 2, 2021 in European Application No. 18874839.6.
Extended European Search Report dated Jul. 20, 2021 in European Application No. 18872006.4.
Office Action dated Sep. 3, 2021 in Chinese Application No. 201880035480.1.
Office Action dated Aug. 11, 2021 in Chinese Application No. 201880029050.9.
Communication dated Feb. 24, 2021 by the Japanese Patent Office in application No. 2020-503962.
Communication dated Mar. 23, 2021 by the Japanese Patent Office in application No. 2020-522897.
Communication dated Mar. 2, 2021 by the Japanese Patent Office in application No. 2020-523669.
Communication dated Mar. 30, 2021 by the Japanese Patent Office in application No. 2020-501446.
Communication dated Mar. 16, 2021 by the Japanese Patent Office in application No. 2020-521441.
Communication dated Feb. 9, 2021 by the Japanese Patent Office in application No. 2020-501205.
Communication dated Mar. 16, 2021 by the European Patent Office in application No. 18806877.9.
Communication dated Apr. 5, 2019 issued by the Korean Patent Office in Korean Application No. 10-2019-0017393.
Communication dated Apr. 25, 2019 by the Korean Patent Office in Korean Application No. 10-2019-0033722.
Communication dated Apr. 25, 2019 by the Korean Patent Office in Korean Application No. 10-2019-0033723.
Communication dated Jun. 7, 2021 by the Canadian Patent Office in Canadian Application No. 3,076,886.
Communication dated Feb. 9, 2018 by the Korean Patent Office in Korean Application No. 10-2017-0058786.
Communication dated Apr. 28, 2021 by the Russian Patent Office is Russian Application No. 2020113632.
Office Action dated Aug. 12, 2019 in Korean Application No. 10-2019-0033722.
Office Action dated Jul. 2, 2019 in Korean Application No. 10-2019-0017392.
Office Action dated Jul. 3, 2019 in Korean Application No. 10-2019-0016835.
Office Action dated May 18, 2019 in Korean Application No. 10-2018-0090063.
Office Action dated Oct. 25, 2019 in Korean Application No. 10-2018-0078296.
Office Action dated Oct. 15, 2019 in Korean Application No. 10-2018-0074188.
Office Action dated Oct. 8, 2019 in Korean Application No. 10-2018-0072992.
Office Action dated Oct. 8, 2019 in Korean Application No. 10-2018-0072935.
Office Action dated Sep. 6, 2019 in Korean Application No. 10-2018-0069645.
Office Action dated Jul. 10, 2019 in Korean Application No. 10-2018-0064487.
Office Action dated Jun. 24, 2019 in Korean Application No. 10-2018-0062137.
Office Action dated Jun. 19, 2019 in Korean Application No. 10-2018-0059580.
Office Action dated May 13, 2019 in Korean Application No. 10-2018-0058596.
Office Action dated May 3, 2019 in Korean Application No. 10-2018-0055120.
Office Action dated Dec. 9, 2019 in Korean Application No. 10-2018-0052133.
Office Action dated Dec. 9, 2019 in Korean Application No. 10-2018-0051469.
Office Action dated Dec. 9, 2019 in Korean Application No. 10-2018-0051467.
International Search Report dated Apr. 16, 2019 in International Application No. PCT/KR2018/012899.
International Search Report dated Apr. 26, 2019 in International Application No. PCT/KR2018/012895.
International Search Report dated May 17, 2019 in International Application No. PCT/KR2018/012810.
International Search Report dated May 17, 2019 in International Application No. PCT/KR2018/012809.
International Search Report dated May 17, 2019 in International Application No. PCT/KR2018/012808.
International Search Report dated May 3, 2019 in International Application No. PCT/KR2018/012807.
International Search Report dated May 17, 2019 in International Application No. PCT/KR2018/012776.
International Search Report dated Apr. 3, 2019 in International Application No. PCT/KR2018/012775.
International Search Report dated Apr. 3, 2019 in International Application No. PCT/KR2018/012774.
International Search Report dated Apr. 3, 2019 in International Application No. PCT/KR2018/012773.
International Search Report dated May 20, 2019 in International Application No. PCT/KR2018/012685.
International Search Report dated May 21, 2019 in International Application No. PCT/KR2018/012676.
International Search Report dated Nov. 26, 2018 in International Application No. PCT/KR2018/005767.
International Search Report dated Aug. 28, 2018 in International Application No. PCT/KR2018/005693.
International Search Report dated Nov. 2, 2018 in International Application No. PCT/KR2018/005306.
Extended European Search Report dated Oct. 15, 2021 in European Application No. 18872138.5.
Communication dated Dec. 3, 2021 from the Chinese Patent Office in Chinese Application No. 201880049465.2.
Communication dated Dec. 2, 2021 from the Chinese Patent Office in Chinese Application No. 201880048657.1.
Communication dated Dec. 2, 2021 from the Chinese Patent Office in Chinese Application No. 201880048444.9.

(56) References Cited

OTHER PUBLICATIONS

Communication dated Jul. 27, 2020 by the Russian Patent Office in application No. 2020110821.
Communication dated Jun. 11, 2020 by the Korean Patent Office in application No. 10-2018-0051469.
Office Action dated Jan. 24, 2022 in Chinese Application No. 201880030661.5.
Office Action dated Dec. 24, 2021 in Chinese Application No. 201880055847.6.
Office Action dated Dec. 20, 2021 in Chinese Application No. 201880048655.2.
Office Action dated Jan. 4, 2022 in Chinese Application No. 201880048703.8.
Office Action dated Jan. 18, 2022 in Chinese Application No. 201880052857.4.
Office Action dated Jan. 30, 2022 in Chinese Application No. 201880052855.5.
"PCB Design and Processing", Seping, pp. 32-35, Beijing Institute of Technology Publishing House, Feb. 2017, Feb. 28, 2017 (6 pages total).
Office Action dated Dec. 31, 2021 in Chinese Application No. 201880049189.X.
Communication dated Feb. 28, 2022 from the Chinese Patent Office in Chinese Application No. 201880063459.2.
Communication dated Mar. 29, 2022 from the Japanese Patent Office in Japanese Application No. 2020-522897.
Communication dated Mar. 3, 2022 from the Chinese Patent Office in Chinese Application No. 201880058682.8.
Wenxue Geng et al., "Technology Manual of a Programmable Controller", Science Technology, 1st Edition, 1996, p. 132 (2 pages total).
Communication dated Jul. 4, 2022 from the Chinese Patent Office in Chinese Application No. 201880048657.1.
Notice of Reasons for Refusal dated Jun. 28, 2022 from the Japanese Patent Office in Japanese Application No. 2020-522897.
Communication dated Jul. 12, 2022 from the Chinese Patent Office in Chinese Application No. 201880049189.X.
Communication dated Jun. 22, 2022 from the Chinese Patent Office in Chinese Application No. 201880048444.9.
"Textbook Heat Transfer of Textbook by Advanced Specialties", Ed. Susann, Major Marine, 1989 (4 pages total).
Second Office Action issued in the China National Intellectual Property Administration dated Aug. 26, 2022 in corresponding Chinese Application No. 2018800487038.

\* cited by examiner

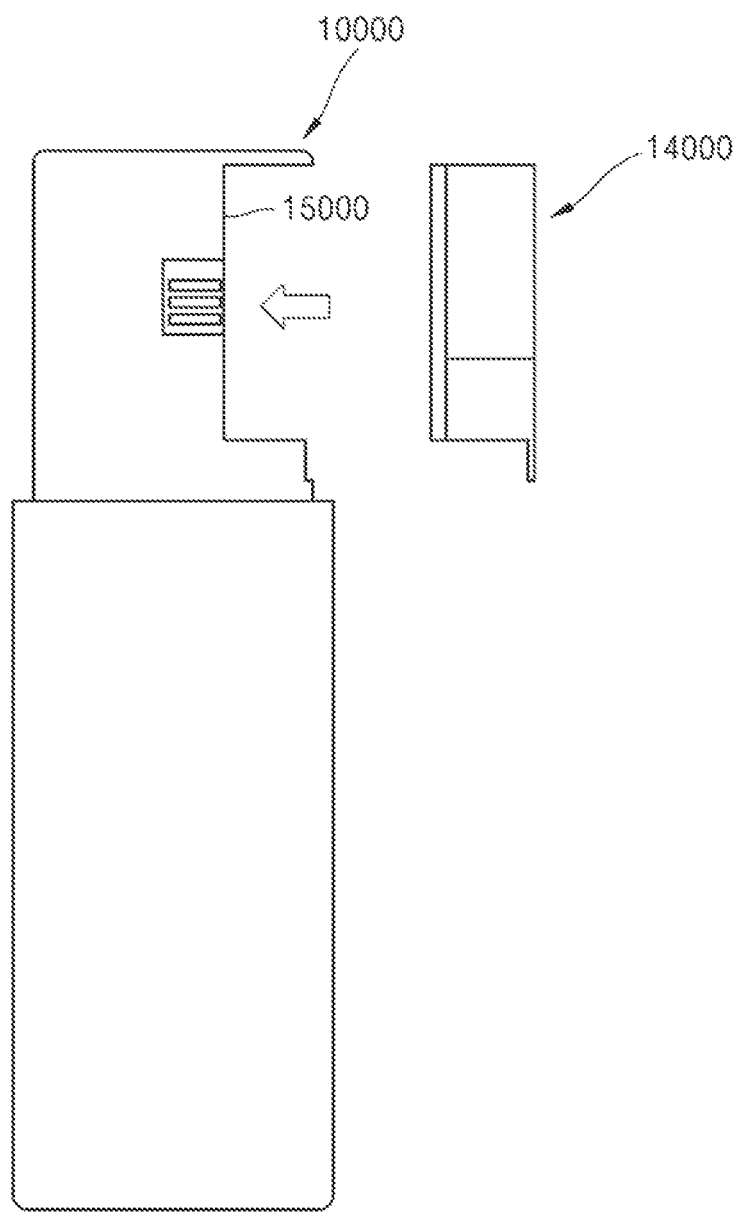

VAPORIZER OF AN AEROSOL GENERATING DEVICE HAVING A LEAKAGE-PREVENTING STRUCTURE

CROSS REFERENCE TO RELATED APPLICATIONS

This application is a National Stage of International Application No. PCT/KR2018/012775 filed Oct. 26, 2018, claiming priority based on Korean Patent Application No. 10-2017-0142578 filed Oct. 30, 2017, and Korean Patent Application No. 10-2018-0072992 filed Jun. 25, 2018.

TECHNICAL FIELD

The present disclosure relates to a vaporizer and an aerosol generating device provided with the same, and more particularly, to a vaporizer having a leakage-preventing structure and an aerosol generating device provided with the vaporizer.

BACKGROUND ART

Recently, there has been increasing demand for alternative methods of overcoming drawbacks of the general cigarettes. For example, there has been increasing demand for a method of generating aerosol by heating an aerosol generating material in a cigarette, rather than a method of generating aerosol by burning a cigarette. Accordingly, research on heated cigarettes or heated aerosol generating devices has been actively conducted.

An aerosol generating device may include a vaporizer capable of generating aerosol. The vaporizer includes a liquid storage, and a liquid composition of the liquid storage is absorbed by a wick and is heated by a liquid heater. The liquid heater generates aerosol by heating the liquid composition and air introduced from the outside. Accordingly, the aerosol generating device has to include an air supplier capable of introducing external air into the vaporizer. However, when a user uses the aerosol generating device, the aerosol or the liquid composition generated in the aerosol generating device may leak into the air supplier. Specifically, when the liquid composition or the aerosol leaks and liquefies again, or when they leak to the outside, it may be unpleasant for the user of the aerosol generating device, and when such leakage occurs repeatedly, components of the aerosol generating device may be contaminated, and thus external air may not be smoothly introduced, thereby degrading performance.

Accordingly, to solve the above problems, there is a need for a structure of an air supplier provided in an aerosol generating device.

DESCRIPTION OF EMBODIMENTS

Technical Problem

Provided are a vaporizer and an aerosol generating device provided with the same. Technical problems to be solved by the present disclosure are not limited to the above-described problems and one of ordinary skill in the art may understand other technical problems from the following description.

Solution to Problem

According to an aspect of the present disclosure, a vaporizer includes: a liquid storage configured to store a liquid composition; an aerosol generator coupled to one end of the liquid storage, and including a wick configured to absorb the liquid composition from the liquid storage, a liquid heater configured to generate aerosol by heating the wick, an aerosol chamber surrounding the wick and the liquid heater, an inlet through which external air is introduced into the aerosol chamber, and an outlet through which the aerosol generated in the aerosol chamber is discharged; and an air supplier configured to supply the external air to the aerosol generator, and including a first opening connected to the inlet of the aerosol generator and a second opening that is opposite to the first opening and connected to the outside at a position spaced apart from the first opening along a direction from the one end to another end of the liquid storage.

In an embodiment, the outlet and the aerosol chamber of the aerosol generator may be aligned in a straight line, and the inlet of the aerosol generator may be formed on a surface of the aerosol chamber facing the liquid storage.

In an embodiment, the air supplier may extend along at least part of the liquid storage.

In an embodiment, the second opening may be formed on a surface of the air supplier extending along at least part of the liquid storage.

In an embodiment, the air supplier may further include a liquid composition leakage preventing member.

In an embodiment, the liquid composition leakage preventing member may include an air-permeable material that allows a gas to pass therethrough and blocks liquid.

In an embodiment, the liquid composition leakage preventing member may have a mesh form.

In an embodiment, the air supplier may further include a plurality of ribs arranged in a lattice form.

In an embodiment, the aerosol generator may further include an accommodating chamber in which a liquefied aerosol in the aerosol chamber is accommodated.

In an embodiment, the accommodating chamber may be coupled to both end portions of the liquid heater to support the liquid heater, and may be arranged in a direction opposite to the liquid storage with respect to the aerosol chamber.

According to another aspect of the present disclosure, an aerosol generating device includes: a case into which a cigarette is to be inserted, the case including a cigarette heater for heating the cigarette; and a vaporizer, wherein the vaporizer is detachably coupled to the case, and delivers the aerosol generated in the aerosol chamber through the outlet to the cigarette in a state where the vaporizer is coupled to the case.

Advantageous Effects of Disclosure

The present disclosure may provide a vaporizer and an aerosol generating device provided with the same. In detail, the vaporizer according to the present disclosure includes a liquid storage, and a liquid composition of the liquid storage is absorbed by a wick and is heated by a liquid heater along with external air to generate aerosol. Accordingly, the aerosol generating device includes an air supplier for introducing external air to the vaporizer. In this case, when a user uses the aerosol generating device, because the aerosol or the liquid composition generated in the aerosol generating device may leak into the air supplier, a first opening of the air supplier may be connected to an inlet of an aerosol generator and a second opening of the air supplier that is opposite to the first opening may be connected to the outside at a position spaced apart from the first opening in a direction from one end of the liquid storage to the other end to supply external air to the aerosol generator, thereby preventing the liquid composition from leaking to the outside through the air supplier.

Also, a liquid composition leakage preventing member or ribs that are arranged in a lattice form may be provided in the air supplier, thereby preventing a liquid, produced when the liquid composition or the generated aerosol is liquefied again, from leaking to the outside.

When the leakage to the outside of the vaporizer is prevented, various problems which may occur to the aerosol generating device and the user of the aerosol generating device, e.g., performance degradation and poor operation of the aerosol generating device, may be avoided.

BRIEF DESCRIPTION OF DRAWINGS

FIG. 8 is a view illustrating an aerosol generating device provided with a vaporizer according to some embodiments.

BEST MODE

A vaporizer includes: a liquid storage configured to store a liquid composition; an aerosol generator including a wick for absorbing the liquid composition from the liquid storage, a liquid heater for generating aerosol by heating the wick, an aerosol chamber surrounding the wick and the liquid heater, an inlet through which external air is introduced into the aerosol chamber, and an outlet through which the aerosol generated in the aerosol chamber is discharged, the aerosol generator being coupled to one end of the liquid storage; and an air supplier having a first opening connected to the inlet of the aerosol generator and a second opening that is opposite the first opening and connected to the outside at a position spaced apart from the first opening in a direction from the one end to the other end of the liquid storage, the air supplier being configured to supply the external air to the aerosol generator.

MODE OF DISCLOSURE

With respect to the terms in the various embodiments, the general terms which are currently and widely used are selected in consideration of functions of structural elements in the various embodiments of the present disclosure. However, meanings of the terms can be changed according to intention, a judicial precedence, the appearance of a new technology, and etc. In addition, in certain cases, a term which is not commonly used can be selected. In such a case, the meaning of the term will be described in detail in the description of the present disclosure. Therefore, the terms used in the various embodiments of the present disclosure should be understood based on the meanings of the terms and the descriptions provided herein.

In addition, unless explicitly described to the contrary, the word "comprise" and variations such as "comprises" or "comprising" will be understood to imply the inclusion of stated elements but not the exclusion of any other elements. In addition, the terms "-er", "-or", and "module" described in the disclosure may mean units for processing at least one function and operation and may be implemented by hardware components or software components and combinations thereof.

Hereinafter, the present disclosure will now be described more fully with reference to the accompanying drawings, in which embodiments of the present disclosure are shown such that one of ordinary skill in the art may easily understand the present disclosure. The disclosure may, however, be embodied in many different forms and should not be construed as being limited to the embodiments set forth herein.

Hereinafter, embodiments of the present disclosure will be described in detail with reference to the drawings.

Figure 1:
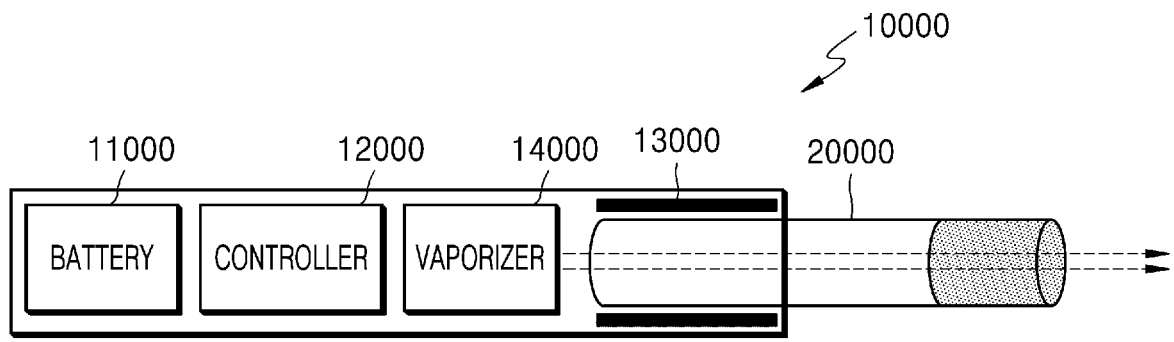
FIGS. 1 and 2 are diagrams showing examples in which a cigarette is inserted into an aerosol generating device.
Figure 2:
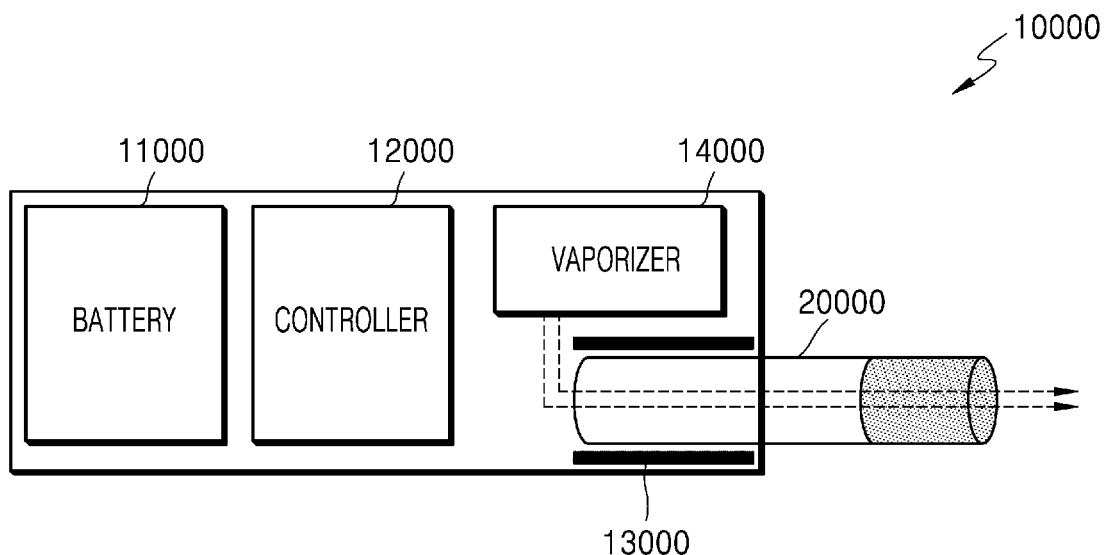

FIGS. 1 and 2 are diagrams showing examples in which a cigarette is inserted into an aerosol generating device.

Referring to FIGS. 1 and 2, an aerosol generating device 10000 includes a battery 11000, a controller 12000, a heater 13000, and a vaporizer 14000. Also, a cigarette 20000 may be inserted into an inner space of the aerosol generating device 10000.

FIGS. 1 and 2 illustrate only components of the aerosol generating device 10000, which are related to the present embodiment. Therefore, it will be understood by one of ordinary skill in the art that other components may be further included in the aerosol generating device 10000, in addition to the components illustrated in FIGS. 1 and 2.

Also, FIGS. 1 and 2 illustrate that the aerosol generating device 10000 includes the heater 13000. However, according to necessity, the heater 13000 may be omitted.

FIG. 1 illustrates that the battery 11000, the controller 12000, the vaporizer 14000, and the heater 13000 are arranged in series. Also, FIG. 2 illustrates that the vaporizer 14000 and the heater 13000 are arranged in parallel. However, the internal structure of the aerosol generating device 10000 is not limited to the structures illustrated in FIG. 1 or FIG. 2. In other words, according to the design of the aerosol generating device 10000, the battery 11000, the controller 12000, the vaporizer 14000, and the heater 13000 may be arranged differently.

When the cigarette 20000 is inserted into the aerosol generating device 10000, the aerosol generating device 10000 may operate the vaporizer 14000 to generate aerosol from the vaporizer 14000. The aerosol generated by the vaporizer 14000 is delivered to the user by passing through the cigarette 20000. The vaporizer 14000 will be described in more detail below.

The battery 11000 may supply power to operate the aerosol generating device 10000. For example, the battery 11000 may supply power to heat the heater 13000 or the vaporizer 14000, and may supply power for operating the controller 12000. Also, the battery 11000 may supply power for operations of a display, a sensor, a motor, etc. included in the aerosol generating device 10000.

The controller 12000 may generally control operations of the aerosol generating device 10000. In detail, the controller 12000 may control not only operations of the battery 11000, the heater 13000, and the vaporizer 14000, but also operations of other components included in the aerosol generating device 10000. Also, the controller 12000 may check a state of each of the components of the aerosol generating device 10000 to determine whether or not the aerosol generating device 10000 is operable.

The controller 12000 may include at least one processor. A processor can be implemented as an array of a plurality of logic gates or can be implemented as a combination of a microprocessor and a memory in which a program executable in the microprocessor is stored. It will be understood by one of ordinary skill in the art that the processor may be implemented in other forms of hardware.

The heater 13000 may be heated by the power supplied from the battery 11000. For example, when the cigarette 20000 is inserted into the aerosol generating device 10000, the heater 13000 may be located outside the cigarette 20000. Thus, the heated heater 13000 may increase the temperature of an aerosol generating material in the cigarette 20000.

The heater 13000 may include an electro-resistive heater. For example, the heater 13000 may include an electrically conductive track, and the heater 13000 may be heated when currents flow through the electrically conductive track. However, the heater 13000 is not limited to the example described above and may include all heaters which may be heated to a desired temperature. Here, the desired temperature may be pre-set in the aerosol generating device 10000 or may be set as a temperature desired by a user.

As another example, the heater 13000 may include an induction heater. In detail, the heater 13000 may include an electrically conductive coil for heating a cigarette in an induction heating method, and the cigarette may include a susceptor which may be heated by the induction heater.

FIGS. 1 and 2 illustrate that the heater 13000 is positioned outside the cigarette 20000, but the position of the cigarette 20000 is not limited thereto. For example, the heater 13000 may include a tube-type heating element, a plate-type heating element, a needle-type heating element, or a rod-type heating element, and may heat the inside or the outside of the cigarette 20000, according to the shape of the heating element.

Also, the aerosol generating device 10000 may include a plurality of heaters 13000. Here, the plurality of heaters 13000 may be inserted into the cigarette 20000 or may be arranged outside the cigarette 20000. Also, some of the plurality of heaters 13000 may be inserted into the cigarette 20000, and the others may be arranged outside the cigarette 20000. In addition, the shape of the heater 13000 is not limited to the shapes illustrated in FIGS. 1 and 2 and may include various shapes.

The vaporizer 14000 may generate an aerosol by heating a liquid composition and the generated aerosol may pass through the cigarette 20000 to be delivered to a user. In other words, the aerosol generated via the vaporizer 14000 may move along an air flow passage of the aerosol generating device 10000 and the air flow passage may be configured such that the aerosol generated via the vaporizer 14000 passes through the cigarette 20000 to be delivered to the user.

For example, the vaporizer 14000 may include a liquid storage, a liquid delivery element, and a heating element, but it is not limited thereto. For example, the liquid storage, the liquid delivery element, and the heating element may be included in the aerosol generating device 10000 as independent modules.

The liquid storage may store a liquid composition. For example, the liquid composition may be a liquid including a tobacco-containing material having a volatile tobacco flavor component, or a liquid including a non-tobacco material. The liquid storage may be formed to be attached to/detached from the vaporizer 14000 or may be formed integrally with the vaporizer 14000.

For example, the liquid composition may include water, a solvent, ethanol, plant extract, spices, flavorings, or a vitamin mixture. The spices may include menthol, peppermint, spearmint oil, and various fruit-flavored ingredients, but are not limited thereto. The flavorings may include ingredients capable of providing various flavors or tastes to a user. Vitamin mixtures may be a mixture of at least one of vitamin A, vitamin B, vitamin C, and vitamin E, but are not limited thereto. Also, the liquid composition may include an aerosol forming substance, such as glycerin and propylene glycol.

The liquid delivery element may deliver the liquid composition of the liquid storage to the heating element. For example, the liquid delivery element may be a wick such as cotton fiber, ceramic fiber, glass fiber, or porous ceramic, but is not limited thereto.

The heating element is an element for heating the liquid composition delivered by the liquid delivery element. For example, the heating element may be a metal heating wire, a metal hot plate, a ceramic heater, or the like, but is not limited thereto. In addition, the heating element may include a conductive filament such as nichrome wire and may be positioned as being wound around the liquid delivery element. The heating element may be heated by a current supply and may transfer heat to the liquid composition in contact with the heating element, thereby heating the liquid composition. As a result, aerosol may be generated.

For example, the vaporizer 14000 may be referred to as a cartomizer or an atomizer, but it is not limited thereto.

The aerosol generating device 10000 may further include other components in addition to the battery 11000, the controller 12000, and the heater 13000. For example, the aerosol generating device 10000 may include a display capable of outputting visual information and/or a motor for outputting haptic information. Also, the aerosol generating device 10000 may include at least one sensor (a puff detecting sensor, a temperature detecting sensor, a cigarette insertion detecting sensor, etc.). Also, the aerosol generating device 10000 may be formed as a structure where, even when the cigarette 20000 is inserted into the aerosol generating device 10000, external air may be introduced into or internal air may be discharged.

Although not illustrated in FIGS. 1 and 2, the aerosol generating device 10000 and an additional cradle may form together a system. For example, the cradle may be used to charge the battery 11000 of the aerosol generating device 10000. Alternatively, the heater 13000 may be heated when the cradle and the aerosol generating device 10000 are coupled to each other.

The cigarette 20000 may be similar to a general combustive cigarette. For example, the cigarette 20000 may be divided into a first portion including an aerosol generating material and a second portion including a filter, etc. Alternatively, the second portion of the cigarette 20000 may also include an aerosol generating material. For example, an aerosol generating material made in the form of granules or capsules may be inserted into the second portion.

The entire first portion may be inserted into the aerosol generating device 10000, and the second portion may be exposed to the outside. Alternatively, only a portion of the first portion may be inserted into the aerosol generating device 10000, or a portion of the first portion and a portion of the second portion may be inserted. The user may puff aerosol while holding the second portion by the user's mouth. In this case, the aerosol is generated by the external air passing through the first portion, and the generated aerosol passes through the second portion and is delivered to the user's mouth.

For example, the external air may flow into at least one air passage formed in the aerosol generating device 10000. For example, the opening and closing and/or a size of the air passage formed in the aerosol generating device 10000 may be adjusted by the user. Accordingly, the amount of smoke and a smoking experience may be adjusted by the user. As another example, the external air may flow into the cigarette 20000 through at least one hole formed on a surface of the cigarette 20000.

Hereinafter, an example of the cigarette 20000 will be described with reference to FIG. 3.

Figure 3:
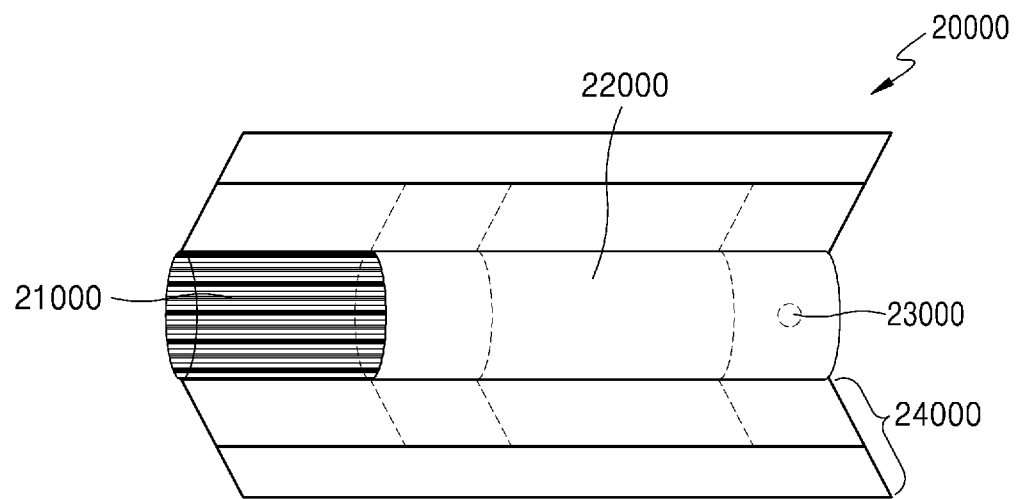
FIG. 3 is a view illustrating an example of a cigarette.

FIG. 3 is a view illustrating an example of a cigarette.

Referring to FIG. 3, the cigarette 20000 may include a tobacco rod 21000 and a filter rod 22000. The first portion described above with reference to FIGS. 1 and 2 may include the tobacco rod 21000, and the second portion may include the filter rod 22000.

FIG. 3 illustrates that the filter rod 22000 includes a single segment. However, the filter rod 22000 is not limited thereto. In other words, the filter rod 22000 may include a plurality of segments. For example, the filter rod 22000 may include a first segment configured to cool an aerosol and a second segment configured to filter a certain component included in the aerosol. Also, according to necessity, the filter rod 22000 may further include at least one segment configured to perform other functions.

The cigarette 2000 may be packaged via at least one wrapper 24000. The wrapper 24000 may have at least one hole through which the external air may be introduced into or the internal air may be discharged. For example, the cigarette 20000 may be packaged via one wrapper 24000. As another example, the cigarette 20000 may be double-packaged via at least two wrappers 24000. For example, the tobacco rod 21000 may be packaged via a first wrapper, and the filter rod 22000 may be packaged via a second wrapper. Also, the tobacco rod 21000 and the filter rod 22000, which are respectively packaged via separate wrappers, may be coupled to each other, and the entire cigarette 20000 may be packaged via a third wrapper. When each of the tobacco rod 21000 and the filter rod 22000 includes a plurality of segments, each segment may be packaged via a separate wrapper. Also, the entire cigarette 20000 including the plurality of segments, which are respectively packaged via the separate wrappers and which are coupled to each other, may be re-packaged via another wrapper.

The tobacco rod 21000 may include an aerosol generating material. For example, the aerosol generating material may include at least one of glycerin, propylene glycol, ethylene glycol, dipropylene glycol, diethylene glycol, triethylene glycol, tetraethylene glycol, and oleyl alcohol, but it is not limited thereto. Also, the tobacco rod 21000 may include other additives, such as flavors, a wetting agent, and/or organic acid. Also, the tobacco rod 21000 may include a flavored liquid, such as menthol or a moisturizer, which is injected to the tobacco rod 21000.

The tobacco rod 21000 may be manufactured in various forms. For example, the tobacco rod 21000 may be formed as a sheet or a strand. Also, the tobacco rod 21000 may be formed as a pipe tobacco, which is formed of tiny bits cut from a tobacco sheet. Also, the tobacco rod 21000 may be surrounded by a heat conductive material. For example, the heat-conducting material may be, but is not limited to, a metal foil such as aluminum foil. For example, the heat conductive material surrounding the tobacco rod 21000 may uniformly distribute the heat generated to the tobacco rod 21000, and thus, the heat conductivity applied to the tobacco rod and the taste of the tobacco may be improved. Also, the heat conductive material surrounding the tobacco rod 21000 may function as a susceptor heated by the induction heater. Here, although not illustrated in the drawings, the tobacco rod 21000 may further include an additional susceptor, in addition to the heat conductive material surrounding the tobacco rod 21000.

The filter rod 22000 may include a cellulose acetate filter. Shapes of the filter rod 22000 are not limited. For example, the filter rod 22000 may include a cylinder-type rod or a tube-type rod having a hollow inside. Also, the filter rod 22000 may include a recess-type rod. When the filter rod 22000 includes a plurality of segments, at least one of the plurality of segments may have a different shape.

The filter rod 22000 may be formed to generate flavors. For example, a flavoring liquid may be injected into the filter rod 22000, or an additional fiber coated with a flavoring liquid may be inserted into the filter rod 22000.

Also, the filter rod 22000 may include at least one capsule 23000. Here, the capsule 23000 may generate a flavor or an aerosol. For example, the capsule 23000 may have a configuration in which a liquid containing a flavoring material is wrapped with a film. The capsule 23000 may have a spherical or cylindrical shape, but is not limited thereto.

When the filter rod 22000 includes a segment configured to cool the aerosol, the cooling segment may include a polymer material or a biodegradable polymer material. For example, the cooling segment may include pure polylactic acid alone, but the material for forming the cooling segment is not limited thereto. In some embodiments, the cooling segment may include a cellulose acetate filter having a plurality of holes. However, the cooling segment is not limited to the above-described examples as long as the cooling segment cools the aerosol.

Although not illustrated in FIG. 3, the cigarette 20000 according to an embodiment may further include a front-end filter. The front-end filter may be located on a side of the tobacco rod 21000, that is, the side facing the filter rod 22000. The front-end filter may prevent the tobacco rod 21000 from being detached outwardly and prevent a liquefied aerosol from flowing into the aerosol generating device 10000 (FIGS. 1 and 2) from the tobacco rod 21000, during smoking.

Hereinafter, embodiments of the present disclosure will be described in detail with reference to the drawings.

Figure 4A:
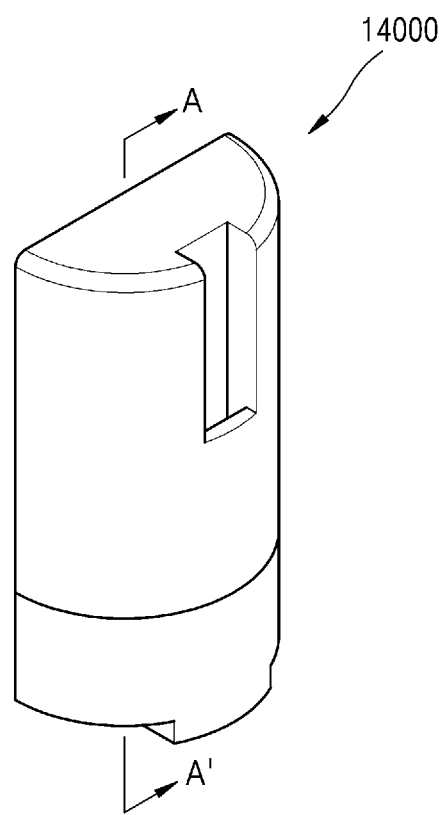
FIG. 4A is a view illustrating a configuration of a vaporizer according to some embodiments.

FIG. 4A is a view illustrating a configuration of a vaporizer according to some embodiments.

Figure 4B:
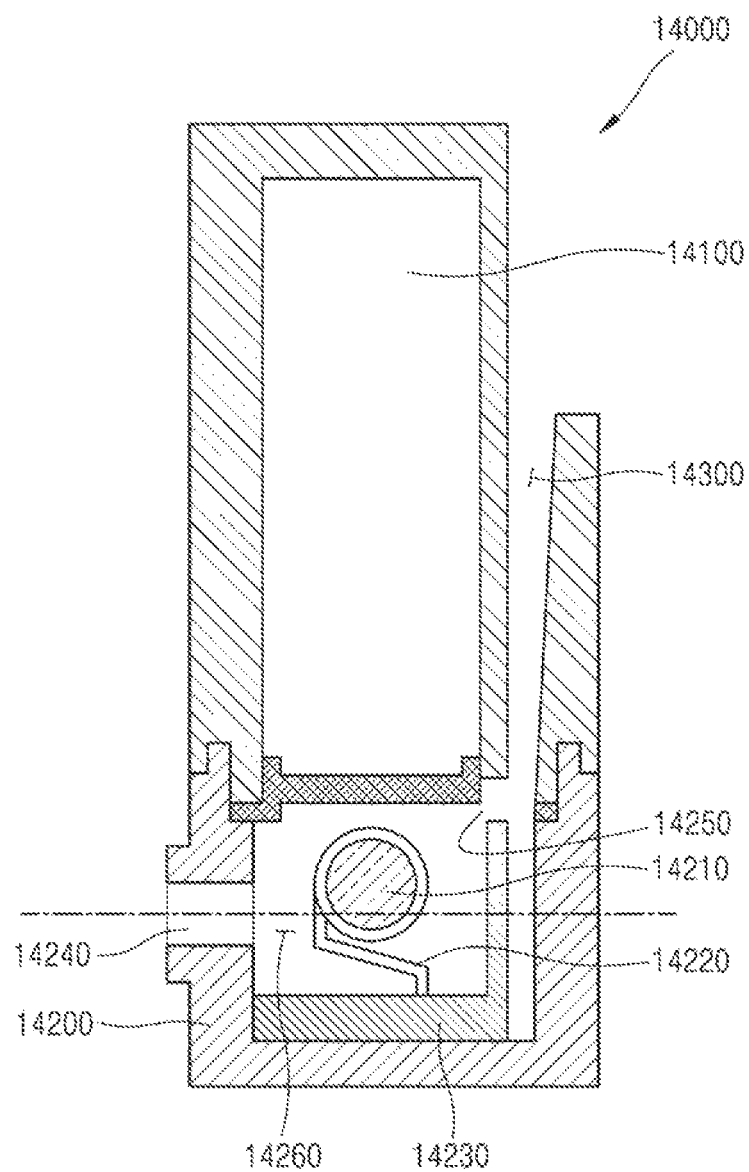
FIG. 4B is a cross-sectional view of the vaporizer of FIG. 4A.

Referring to FIG. 4A, a cross-sectional view taken along line A-A' is illustrated in FIG. 4B.

FIG. 4B is a cross-sectional view of the vaporizer of FIG. 4A.

Referring to FIG. 4B, the vaporizer 14000 may include a liquid storage 14100, an aerosol generator 14200, and an air supplier 14300. Here, FIG. 4B illustrates only the components of the vaporizer 14000 that are related to the present embodiments. Accordingly, it will be understood by one of ordinary skill in the art that other components in addition to the components illustrated in FIG. 4B may be further included in the vaporizer 14000.

The liquid storage 14100 may store a liquid composition. Also, the liquid storage 14100 may have a certain shape for storing the liquid composition. For example, the liquid storage 14100 may have a prism shape including a cylindrical shape, or a spherical shape. However, the present disclosure is not limited thereto. The liquid storage 14100 may have an outlet through which the stored liquid composition may flow to the aerosol generator 14200.

Also, the aerosol generator 14200 may include a wick 14210, a liquid heater 14220, an aerosol chamber 14260 surrounding the wick 14210 and the liquid heater 14220, an outlet 14240 through which aerosol is discharged, and an inlet 14250 through which external air is introduced into the aerosol chamber 14260. Also, the aerosol generator 14200 may be coupled to an end of the liquid storage 14100. The wick 14210 included in the aerosol generator 14200 may absorb the liquid composition from the liquid storage 14100. When the liquid composition is absorbed by the wick 14210, the liquid heater 14220 may generate aerosol by heating the wick 14210 along with the introduced external air.

In detail, examples of the liquid heater 14220 for heating the liquid composition delivered by the wick 14210 may include, but are not limited to, a metal heating wire, a metal hot plate, and a ceramic heater. Also, the liquid heater 14220 may include a conductive filament such as a nichrome wire, and may be wound around the wick 14210. The liquid heater 14210 may be heated by the supply of current, and may heat the liquid composition by providing heat to the liquid composition in contact with the liquid heater 14210. Aerosol may be generated due to the heated liquid composition.

Figure 5A:
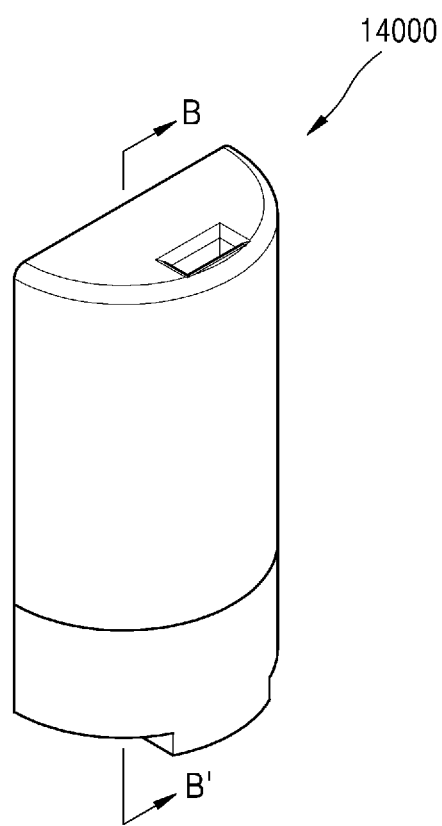
FIG. 5A is a view illustrating a configuration of a vaporizer according to some embodiments.

FIG. 5A is a view illustrating a configuration of a vaporizer according to some embodiments.

Figure 5B:
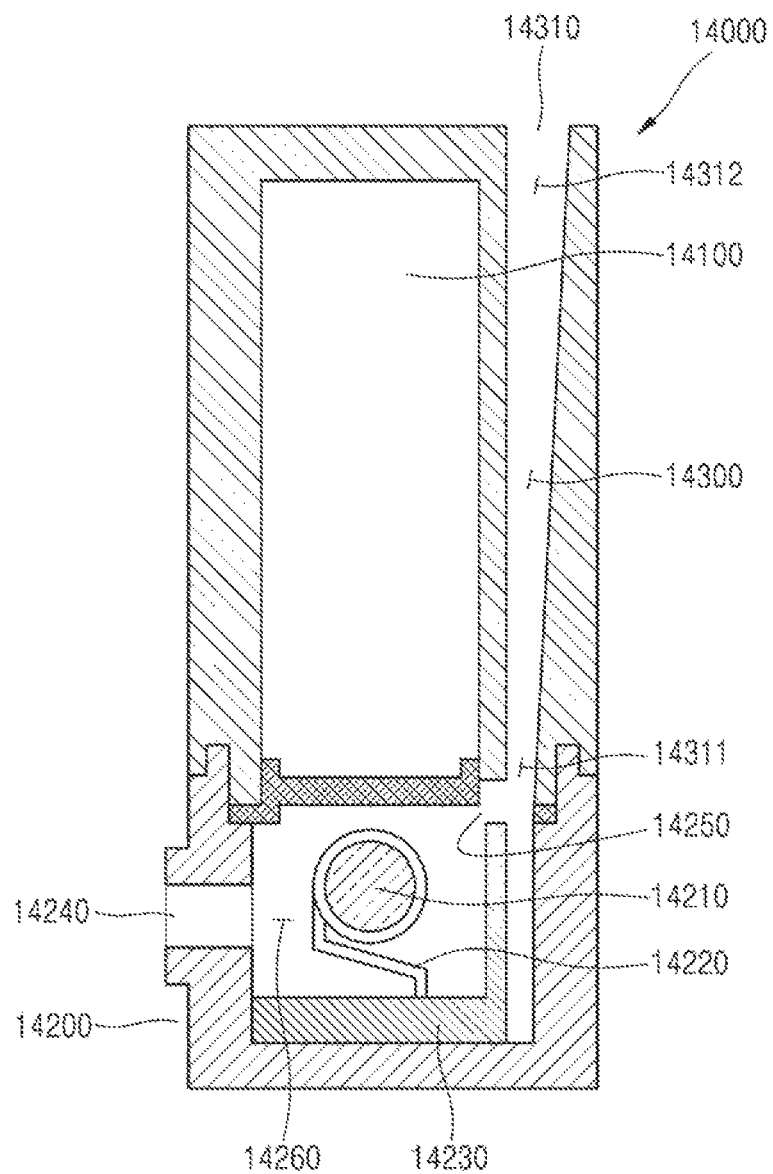
FIG. 5B is a cross-sectional view of the vaporizer of FIG. 5A.

Referring to FIG. 5A, a cross-sectional view taken along line B-B' is illustrated in FIG. 5B.

FIG. 5B is a cross-sectional view of the vaporizer of FIG. 5A.

Referring to FIG. 5B, the air supplier 14300 may include an air passage 14310. In detail, a first opening 14311 of the air supplier 14300 may be connected to the inlet 14250 of the aerosol generator 14200, and a second opening 14312 of the air supplier 14300 opposite to the first opening 14311 may be spaced apart from the first opening 14311 along a direction from one end where the liquid storage 14100 and the aerosol generator 14200 are coupled, to the other end. The second opening 14312 may be the air passage 14310 connected to the outside, and may allow external air to be supplied to the aerosol generator 14200.

That is, external air may be introduced through the air passage 14310 into the air supplier 14300, and may be introduced through the inlet 14250 of the aerosol generator 14200 connected to the first opening of the air supplier 14300 into the aerosol generator 14200. Alternatively, referring to FIG. 4B, external air may be directly introduced into the air supplier 14300 without passing through the air passage 14310. As such, external air introduced into the aerosol generator 14200 may be heated by the liquid heater 14220 along with a liquid composition absorbed by the wick 14210 to generate aerosol. The generated aerosol may be discharged to the outside through the outlet 14240.

Also, the outlet 14240 and the aerosol chamber 14260 surrounding the wick 14210 and the liquid heater 14220 may be aligned in a straight line (e.g., the dotted line shown in FIG. 4B), and the inlet 14250 of the aerosol generator 14200 may be formed on a surface of the aerosol chamber 14260 facing the liquid storage 14100. However, the present disclosure is not limited thereto, and the inlet 14250 of the aerosol generator 14200 may be formed on a side surface of the aerosol chamber 14260 not facing the liquid storage 14100, and all of the outlet 14240 and the wick 14210 of the aerosol generator 14200, the aerosol chamber 14260 surrounding the liquid heater 14220, and the inlet 14250 of the aerosol generator 14200 may be aligned in a straight line. Alternatively, the outlet 14240 and the wick 14210 of the aerosol generator 14200, and the aerosol chamber 14260 surrounding the liquid heater 14220 may be aligned in a straight line, and the inlet 14250 of the aerosol generator 14200 may be deviated from the straight line. In detail, because an air flow passage is formed in a straight line, resistance to the flow may be minimized, and thus a stable air flow may be provided for optimal aerosol generation.

However, when the inlet 14250 of the aerosol generator 14200 is aligned with or located under the aerosol generator 14200 that generates aerosol, the aerosol or the liquid composition is more likely to leak into the inlet 14250 of the aerosol generator 14200. To prevent this problem, when the inlet 14250 of the aerosol generator 14200 is formed on a surface facing the liquid storage 14100, that is, an upper end of the aerosol chamber 14260, the leakage of the liquid composition may be reduced. Alternatively, even when the inlet 14250 is formed in a side surface instead of the upper end, if the outlet 14240 and the wick 14210 of the aerosol generator 14200, and the aerosol chamber 14260 surrounding the liquid heater 14220 are aligned in a straight line and the inlet 14250 of the aerosol generator 14200 is formed over the straight line, the leakage of the liquid composition may be reduced. A position of the inlet 14250 of the aerosol generator 14200 is different in FIGS. 5B and 6B, but the present disclosure is not limited thereto and the inlet 14250 of the aerosol generator 14200 may be located at other positions.

A structure of a vaporizer will now be described in more detail with reference to FIGS. 6A and 6B.

Figure 6A:
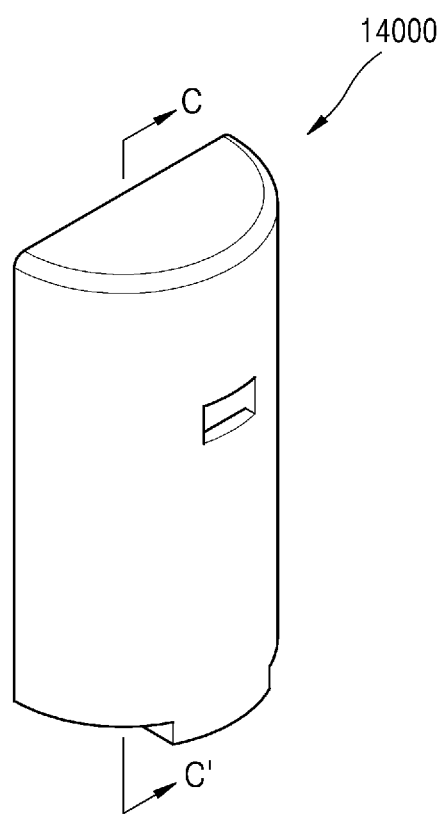
FIG. 6A is a view illustrating a configuration of a vaporizer according to some embodiments.

FIG. 6A is a view illustrating a configuration of a vaporizer according to some embodiments.

Figure 6B:
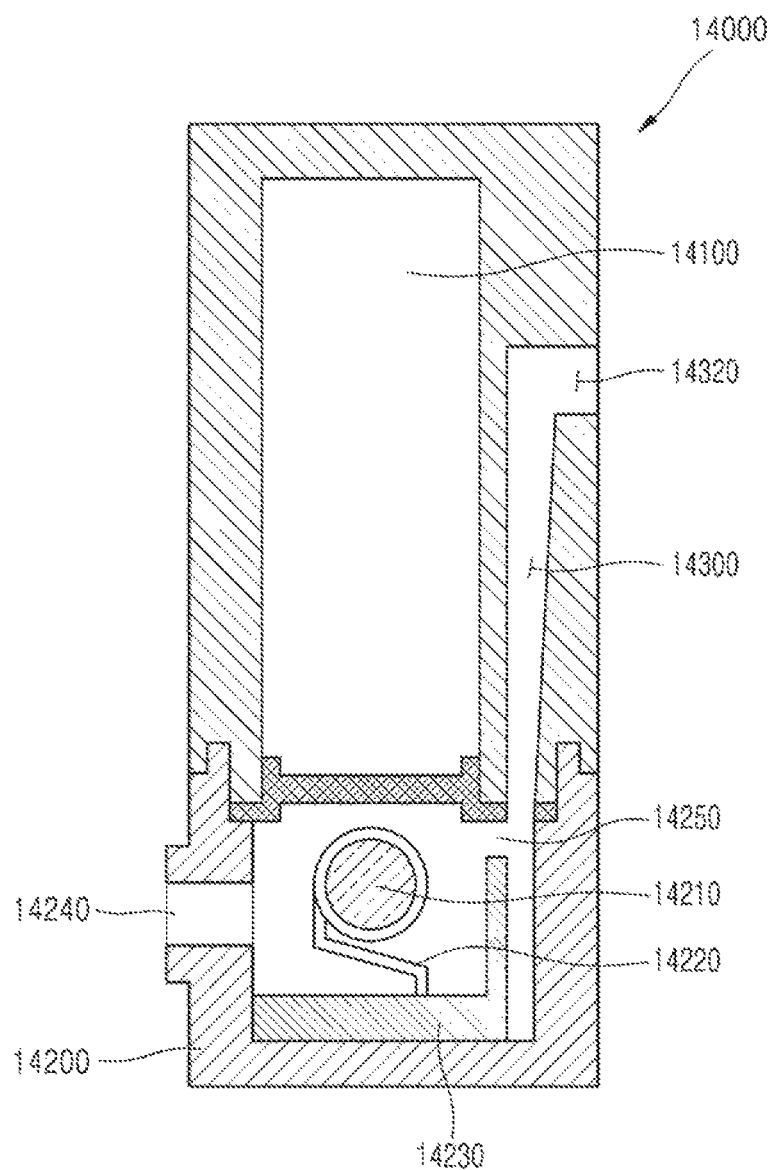
FIG. 6B is a cross-sectional view of the vaporizer of FIG. 6A.

Referring to FIG. 6A, a cross-sectional view taken along line C-C' is illustrated in FIG. 6B.

FIG. 6B is a cross-sectional view of the vaporizer of FIG. 6A.

Referring to FIG. 6B, the vaporizer 14000 may include the liquid storage 14100, the aerosol generator 14200, and the air supplier 14300, and the aerosol generator 14200 may further include an accommodating chamber 14230. FIG. 5B illustrates only the components of the vaporizer 14000 that are related to the present embodiment. Accordingly, it will be understood by one of ordinary skill in the art that other components in addition to the components illustrated in FIG. 5B may be further included in the vaporizer 14000.

The air supplier 14300 may extend along at least a part of the liquid storage 14100. In this case, a second opening, that is, an air passage 14320, of the air supplier 14300 may be formed on a surface of the air supplier 14300 extending along at least a part of the liquid storage 14100. When the air supplier 14300 extends along at least a part of the liquid storage 14100, it means that a length of the air supplier 14300 may further increase along the liquid storage 14100. As such, when aerosol or a liquid composition leaks into the inlet 14250 of the aerosol generator 14200 and is discharged to the outside through the air supplier 14300, the aerosol or the liquid composition is less likely to be discharged to the outside as the length of the air supplier 14300 increases.

Also, if the length of the air supplier 14300 increases, it may be difficult to supply sufficient air to generate aerosol when a user uses the aerosol generating device 10000. To prevent this problem, the air passage 14320 may be formed on a side surface of the air supplier 14300 extending along at least a part of the liquid storage 14100, and the air passage 14320 may be configured to have a larger area.

As described above, according to an embodiment of the present disclosure, when the user uses the aerosol generating device 10000 by adjusting the length of the air supplier

14300 and a position of the inlet 14250 of the aerosol generator 14200 connected to the air supplier 14300, the aerosol or the liquid composition generated in the aerosol generating device 10000 may be prevented from leaking into the air supplier 14300.

As described above, the vaporizer 14000 may include the aerosol generator 14200, and the aerosol generator 14200 may further include the accommodating chamber 14230. Also, the accommodating chamber 14230 may be coupled to both end portions of the liquid heater 14220 to support the liquid heater 14220, and may be located in a direction opposite to the liquid storage 14100 with respect to the aerosol chamber 14260. In detail, the accommodating chamber 14230 may collect a liquid leakage and foreign materials, and may fix and maintain a position of the liquid heater 14220 by being connected to the both end portions of the liquid heater 14220.

The accommodating chamber 14230 may be located inside the aerosol generator 14200 and may accommodate various foreign materials. In detail, the aerosol generated in the aerosol generator 14200 may not be discharged to the outside through the outlet 14240, but may be liquefied again inside the aerosol generator 14200. When a liquid becomes aerosol and then is liquefied again, it may be referred to as a liquid leakage, and the liquid leakage may occur inside the aerosol generator 14200, or may leak into other components of the vaporizer 14000 and the aerosol generating device 10000, to contaminate the components to degrade performance, and even make the vaporizer 14000 and the aerosol generating device 10000 inoperable.

To prevent the above problem, the accommodating chamber 14230 may be located in a direction opposite to the liquid storage 14100 with respect to the aerosol chamber 14260, that is, located at a lower end the aerosol generator 14200. As such, when a liquid leakage occurs during an operation of the aerosol generating device 10000 and the liquid flows down, the liquid leakage may be introduced into the accommodating chamber 14230.

Figure 7:
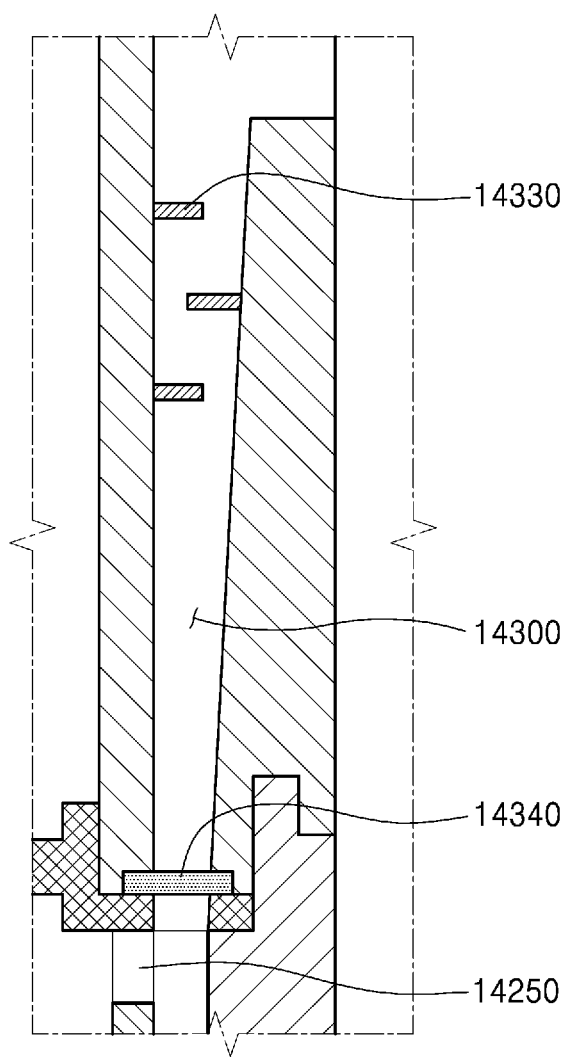
FIG. 7 is a view illustrating a configuration of a vaporizer according to some embodiments.

FIG. 7 is a view illustrating a configuration of a vaporizer according to some embodiments. In detail, FIG. 7 is a detailed view illustrating an internal configuration of the air supplier 14300.

Referring to FIG. 7, the air supplier 14300 connected to the inlet 14250 of the aerosol generator 14200 may further include a liquid composition leakage preventing member 14340 and a plurality of ribs 14330. Only the components of the vaporizer 14000 of FIG. 6B related to the present embodiment are illustrated. Accordingly, it will be understood by one of ordinary skill in the art that other components in addition to the components illustrated in FIG. 6B may be further included in the vaporizer 14000.

The liquid composition leakage preventing member 14340 may be located at a position where the inlet 14250 of the aerosol generator 14200 and the air supplier 14300 are connected to prevent the liquid leakage. However, the present disclosure is not limited thereto and the liquid composition leakage preventing member 14340 may also be formed inside the air supplier 14300. The liquid composition leakage preventing member 14340 blocks liquid and passes gas therethrough. This is because external air for generating aerosol has to be introduced through the air supplier 14300 into the aerosol generator 14200. To this end, the liquid composition leakage preventing member 14340 may include a breathable material. In detail, the liquid composition leakage preventing member 14340 may include at least one of breathable materials such as GORE-TEX® or BREATHRON®, or a combination thereof. However, the present disclosure is not limited thereto, and the liquid composition leakage preventing member 14340 may include any materials that block liquid and passes gas therethrough.

Also, the shape of the liquid composition leakage preventing member 14340 may be a net shape or a mesh form, but the present disclosure is not limited thereto. The liquid composition leakage preventing member 14340 may be manufactured to have various shapes. The amount of external air introduced into the aerosol generating device 10000 may be adjusted according to the shape of the liquid composition leakage preventing member 14340. As the amount of external air introduced into the aerosol generating device 10000 is adjusted, the vaporizer 14000 may generate high-quality aerosol.

Also, the air supplier 14300 may further include the plurality of ribs 14330 that are arranged in a lattice form. In detail, the ribs 14330 may be alternately located on both inner side surfaces of the air supplier 14300. Although a liquid leaking from the aerosol generator 14200 may be first blocked by the liquid composition leakage preventing member 14340 from being introduced into the air supplier 14300, because aerosol is a gas, the aerosol may pass through the liquid composition leakage preventing member 14340 and may be introduced into the air supplier 14300. When the introduced aerosol passes through the air supplier 14300 and a temperature of the aerosol is reduced, the aerosol may be liquefied again and may remain as a foreign material in the air supplier 14300. When the foreign material leaks to the outside through an air passage, it may be unpleasant to a user.

To prevent the problem, the plurality of ribs 14330 may be alternately located on both inner side surfaces of the air supplier 14300. However, the present disclosure is not limited thereto, and the plurality of ribs 14330 may be located at other positions in order to prevent a foreign material from leaking to the outside through the air passage.

FIG. 8 is a view illustrating an aerosol generating device provided with a vaporizer according to some embodiments.

Referring to FIG. 8, the vaporizer 14000 may be detachably coupled to the aerosol generating device 10000 according to an embodiment of the present disclosure. In detail, when the vaporizer 14000 is detachably coupled to the aerosol generating device 10000, it means that a state in which the vaporizer 14000 is coupled to the aerosol generating device 10000 is maintained while the vaporizer 14000 performs a function of generating aerosol, and the vaporizer 14000 may be separated from the aerosol generating device 10000 when the vaporizer 14000 is replaced with a new one.

Also, the aerosol generating device 10000 may further include a case 15000 into which a cigarette may be inserted, which includes a cigarette heater for heating the cigarette. The vaporizer 14000 according to an embodiment of the present disclosure may be detachably coupled to the case 15000 and may deliver aerosol generated in the aerosol chamber 14260 through an outlet to the cigarette in a state where the vaporizer 14000 is coupled to the case 15000. A process of delivering aerosol through the cigarette to a user has been described in the above.

When a user uses an aerosol generating device, a liquid composition may leak out to the outside of the aerosol generating device or leak into other components in the aerosol generating device causing a liquid leakage.

When such leakage repeatedly occurs, the components of the aerosol generating device may be contaminated and may degrade the performance, and even cause the aerosol generating device to malfunction. Also, when a liquid composition is discharged to an air inlet of the aerosol generating device, the discharged liquid composition may cause discomfort to the aerosol generating device user.

A vaporizer according to embodiments of the present disclosure has a structure for preventing a liquid leakage of a liquid composition and thus may prevent the leakage of the liquid composition to the outside of the vaporizer. As the liquid leakage is prevented, the above-described problems that may occur due to the liquid leakage may also be prevented, thereby providing convenience to users of the aerosol generating device.

While the present disclosure has been particularly shown and described with reference to embodiments thereof, it will be understood by one of ordinary skill in the art that various changes may be made therein without departing from the spirit and scope of the disclosure as defined by the following claims. Thus, the embodiments should be considered in a descriptive sense only and not for purposes of limitation. Therefore, the scope of the disclosure is not limited by the detailed description of the disclosure, and all modifications to the present disclosure are within the scope of the present disclosure.

What is claimed is:

1. A vaporizer comprising:
a liquid storage configured to store a liquid composition;
an aerosol generator coupled to one end of the liquid storage, and comprising:
a wick configured to absorb the liquid composition from the liquid storage;
a liquid heater configured to generate aerosol by heating the wick;
an aerosol chamber surrounding the wick and the liquid heater;
an inlet through which external air is introduced into the aerosol chamber; and
an outlet through which the aerosol generated in the aerosol chamber is discharged; and
an air supplier configured to supply the external air to the aerosol generator, and comprising:
a first opening connected to the inlet of the aerosol generator; and
a second opening that is opposite to the first opening and connected to the outside at a position spaced apart from the first opening along a direction from the one end to another end of the liquid storage,
wherein the outlet and the aerosol chamber of the aerosol generator are aligned in a straight line, and the inlet of the aerosol generator is formed on a surface of the aerosol chamber facing the liquid storage.

2. The vaporizer of claim 1, wherein the air supplier extends along at least part of the liquid storage.

3. The vaporizer of claim 2, wherein the second opening is formed on a surface of the air supplier extending along at least part of the liquid storage.

4. An aerosol generating device comprising:
a case into which a cigarette is to be inserted, the case comprising a cigarette heater for heating the cigarette; and
a vaporizer according to claim 1,
wherein the vaporizer is detachably coupled to the case, and delivers the aerosol generated in the aerosol chamber through the outlet to the cigarette in a state where the vaporizer is coupled to the case.

5. A vaporizer comprising:
a liquid storage configured to store a liquid composition;
an aerosol generator coupled to one end of the liquid storage, and comprising:
a wick configured to absorb the liquid composition from the liquid storage;
a liquid heater configured to generate aerosol by heating the wick;
an aerosol chamber surrounding the wick and the liquid heater;
an inlet through which external air is introduced into the aerosol chamber; and
an outlet through which the aerosol generated in the aerosol chamber is discharged; and
an air supplier configured to supply the external air to the aerosol generator, and comprising:
a first opening connected to the inlet of the aerosol generator; and
a second opening that is opposite to the first opening and connected to the outside at a position spaced apart from the first opening along a direction from the one end to another end of the liquid storage,
wherein the air supplier further comprises a liquid composition leakage preventing member.

6. The vaporizer of claim 5, wherein the liquid composition leakage preventing member comprises an air-permeable material that allows gas to pass therethrough and blocks liquid.

7. The vaporizer of claim 5, wherein the liquid composition leakage preventing member comprises a mesh form.

8. The vaporizer of claim 5, wherein the air supplier further comprises a plurality of ribs arranged in a lattice form.

9. A vaporizer comprising:
a liquid storage configured to store a liquid composition;
an aerosol generator coupled to one end of the liquid storage, and comprising:
a wick configured to absorb the liquid composition from the liquid storage;
a liquid heater configured to generate aerosol by heating the wick;
an aerosol chamber surrounding the wick and the liquid heater;
an inlet through which external air is introduced into the aerosol chamber; and
an outlet through which the aerosol generated in the aerosol chamber is discharged; and
an air supplier configured to supply the external air to the aerosol generator, and comprising:
a first opening connected to the inlet of the aerosol generator; and
a second opening that is opposite to the first opening and connected to the outside at a position spaced apart from the first opening along a direction from the one end to another end of the liquid storage,
wherein the aerosol generator further comprises an accommodating chamber in which a liquefied aerosol in the aerosol chamber is accommodated.

10. The vaporizer of claim 9, wherein the accommodating chamber is coupled to both end portions of the liquid heater to support the liquid heater, and is arranged in a direction opposite to the liquid storage with respect to the aerosol chamber.

* * * * *